(12) United States Patent
Liu (10) Patent No.: US 9,251,861 B2
(45) Date of Patent: Feb. 2, 2016

(54) MEMORY CONNECTION STRUCTURE OF STORAGE DEVICE

(71) Applicant: Shu-Min Liu, New Taipei (TW)

(72) Inventor: Shu-Min Liu, New Taipei (TW)

( * ) Notice: Subject to any disclaimer, the term of this patent is extended or adjusted under 35 U.S.C. 154(b) by 356 days.

(21) Appl. No.: 13/870,689

(22) Filed: Apr. 25, 2013

(65) Prior Publication Data

US 2014/0321066 A1   Oct. 30, 2014

(51) Int. Cl.
  *G11C 5/06*   (2006.01)
  *H05K 1/02*   (2006.01)

(52) U.S. Cl.
  CPC ............... *G11C 5/06* (2013.01); *H05K 1/0228* (2013.01); *H05K 1/0243* (2013.01); *H05K 2201/10159* (2013.01); *H05K 2201/10325* (2013.01)

(58) Field of Classification Search
  CPC ................... G11C 5/06–5/066; H05K 1/0228
  See application file for complete search history.

(56) References Cited

U.S. PATENT DOCUMENTS

2005/0047250 A1*   3/2005   Ruckerbauer .......... G11C 5/063
                                                              365/222

\* cited by examiner

*Primary Examiner* — Ramon M Barrera
(74) *Attorney, Agent, or Firm* — Muncy, Geissler, Olds & Lowe, P.C.

(57) ABSTRACT

A memory connection structure of a storage device is disclosed. The storage device includes a circuit board, a memory controller, a bus, and a memory module. The memory controller, the bus, and the memory module are electrically connected on the circuit board. The memory module is composed of a plurality of memory sockets and a plurality of volatile memories. The volatile memories are connected to the same bus via the corresponding memory sockets and connected to the memory controller via the bus. The bus has at least one connection point and each connection point is connected to two memory sockets. The circuit board has a front surface and a rear surface, and two memory sockets connected to the same connection point are correspondingly installed on each of the two surfaces of the circuit board. In addition, two distances between the each memory socket and the memory controller are identical.

12 Claims, 10 Drawing Sheets

MEMORY CONNECTION STRUCTURE OF STORAGE DEVICE

BACKGROUND

1. Technical Field

The present disclosure relates generally to a storage device, and more particularly to an improved memory connection structure in a storage device.

2. Description of Related Art

In general, a storage device is composed of volatile memories which are connected in series on the same bits. As a result, when the storage device accesses data, a problem of signal reflection would easily occur.

Figure 1:
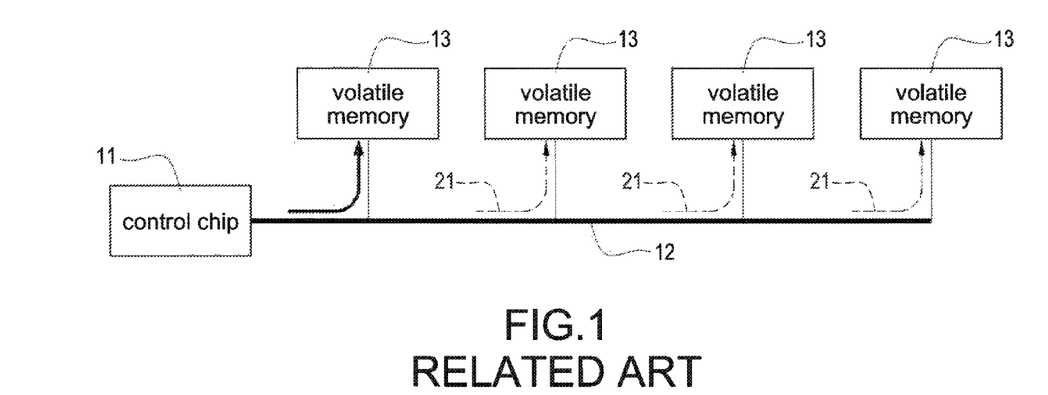
FIG. 1 is an architecture view of a related art first memory.
Figure 2:
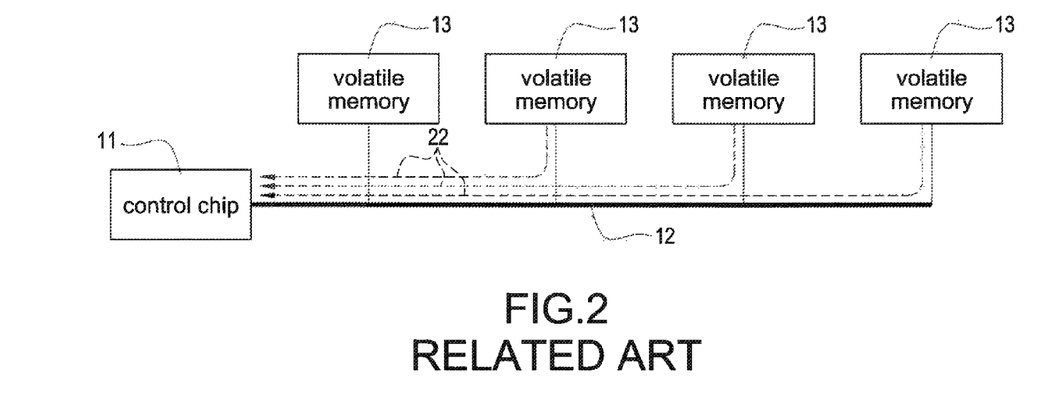
FIG. 2 is an architecture view of a related art second memory.

Reference is made to FIG. 1 and FIG. 2 which are an architecture view of a related art. first memory and an architecture view of a related art second memory, respectively. The storage device mainly includes a control chip 11, a bus 12, and a plurality of volatile memories 13. The control chip 11 is connected to the volatile memories 13 via the bus 12. As shown in FIG. 1, when the control chip 11 accesses only one of the volatile memories 13, micro currents 21 would flow to other non-accessed volatile memories 13. hi addition, when the length of the bus is longer, namely the amount of the in-series volatile memories 13 on the bus 12 is more and the currents flowing to the volatile memories 13 are higher.

Because the non-accessed volatile memories 13 are not driven by the currents, the currents would reflect to the control chip 11 to form reflected currents 22 as shown in FIG. 2, thus generating the phenomenon of signal flection. As mentioned above, once the amount of the in-series volatile memories 13 on the bus 12 is more, the reflected currents 22 are higher. However, the reflected currents 22 would interfere with and even mistake the original access signals and data.

In order to overcome the problem of signal reflection, the technology of on-die termination (ODT) is introduced. In general, the volatile memory 13 must have the built-in ODT pin; the control chip 11 can implement the ODT function of the volatile memory 13 via the ODT pin, such as the DDR3. The ODT function is executed so that a specific value resistor is simulated in the volatile memory 13. Accordingly, when the volatile memory 13 receives the micro currents 21, the received micro current 21 could be guided to the resistor, but would not form the reflected currents 22.

When the ODT function of the volatile memory 13 is executed, however, the overall power consumption of the storage device would be increased, thus causing its temperature to increase. In experiments performed by the applicants, when the volatile memory 13 is continuously accessed for 30 minutes at 23-degree room temperature without executing the ODT function, the average temperature of the volatile memory 13 is 33 degrees Celsius. In particular, the average consumption current and power of accessing the volatile memory 13 are 1.1 amperes and 1.65 watts, respectively. Also, the average consumption current and power of writing the volatile memory 13 are 1.2 amperes and 1.8 watts, respectively. On the contrary, when the volatile memory 13 is operated with executing the ODT function, the average temperature of the volatile memory 13 is 37.9 degrees Celsius. In particular, the average consumption current and power of accessing the volatile memory 13 are 1.2 amperes and 1.8 watts, respectively. Also, the average consumption current and power of writing the volatile memory 13 are 2.8 amperes and 4.2 watts, respectively.

As mentioned above, although the ODT function can be used to overcome the problem of signal reflection, the caused higher temperature, consumption current, and consumption power and are inevitable. For this reason, it is very significant for technicians to research and develop solutions to overcome the problem of the signal reflection without using the ODT technology.

SUMMARY

An object of the present disclosure is to provide a memory connection structure of a storage device to solve the problem of noise interference caused by the signal reflection.

In order to achieve the object, the present disclosure provides a storage device which has a circuit board, a memory controller, a bus, and a memory module. The memory controller, the bus, and the memory module are electrically connected on the circuit board, respectively. The memory module is composed of a plurality of memory sockets and a plurality of volatile memories. The volatile memories are connected to the same bus via the corresponding memory sockets and connected to the memory controller via the bus. The bus has at least one connection point and each connection point is connected to two memory sockets. The circuit board has a front surface and a rear surface, and two memory sockets connected to the same connection point are correspondingly installed on each of the two surfaces of the circuit board. In addition, two distances between the each of the two memory sockets and the memory controller are identical.

The technology feature of the present disclosure is that at least two memory sockets and at least two volatile memories are arranged up and down a circuit board and correspondingly connected at a same connection point of a bus of the circuit board. When the signal reflection occurs, the current reflected from one volatile memory arranged up the circuit board is cancelled by the current reflected from the other volatile memory arranged down the circuit board, thus leaving the extremely tiny amount of residual current. Accordingly, the volatile memories do not have or do not use the ODT function that can overcome the problem of the signal reflection in the storage device. Especially, the overall power consumption of the storage device can be reduced and storage device can be operated under a more stable condition.

In addition, more volatile memories can be connected to the same bus so as to significantly and effectively increase the burden of storage capacity of the storage device.

BRIEF DESCRIPTION OF DRAWINGS

The features of the present disclosure believed to be novel are set forth with particularity in the appended claims. The present disclosure itself, however, may be best understood by reference to the following detailed description of the present disclosure, which describes an exemplary embodiment of the present disclosure, taken in conjunction with the accompanying drawings, in which:

DETAILED DESCRIPTION

Reference will now be made to the drawing figures to describe the present disclosure in detail.

Figure 5:
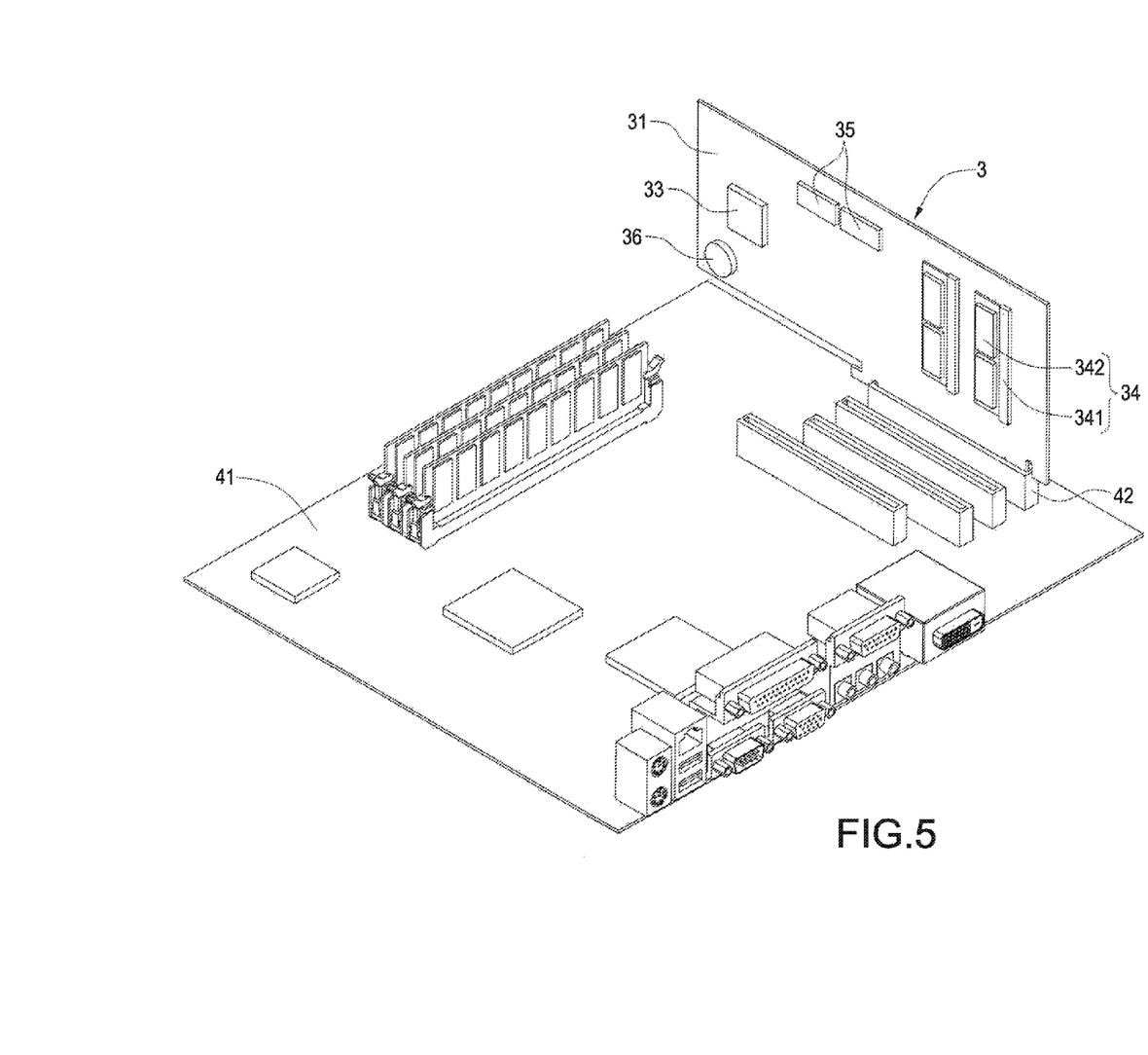
FIG. 5 is a schematic view of installing the storage device according to the first embodiment of the present disclosure.
Figure 6:
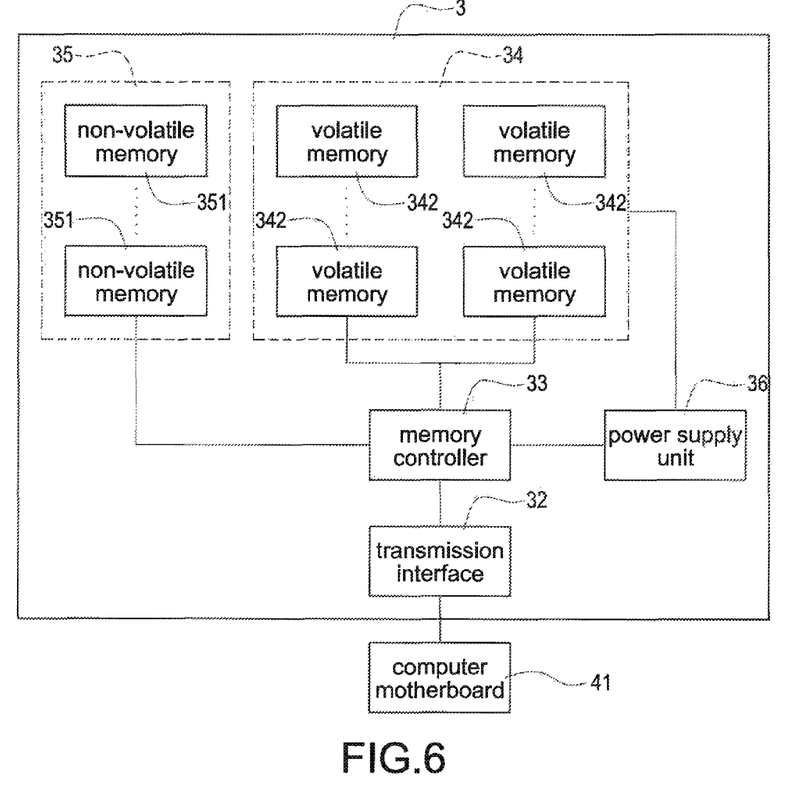
FIG. 6 is a block diagram of the storage device according to the first embodiment of the present disclosure.
Figure 7:
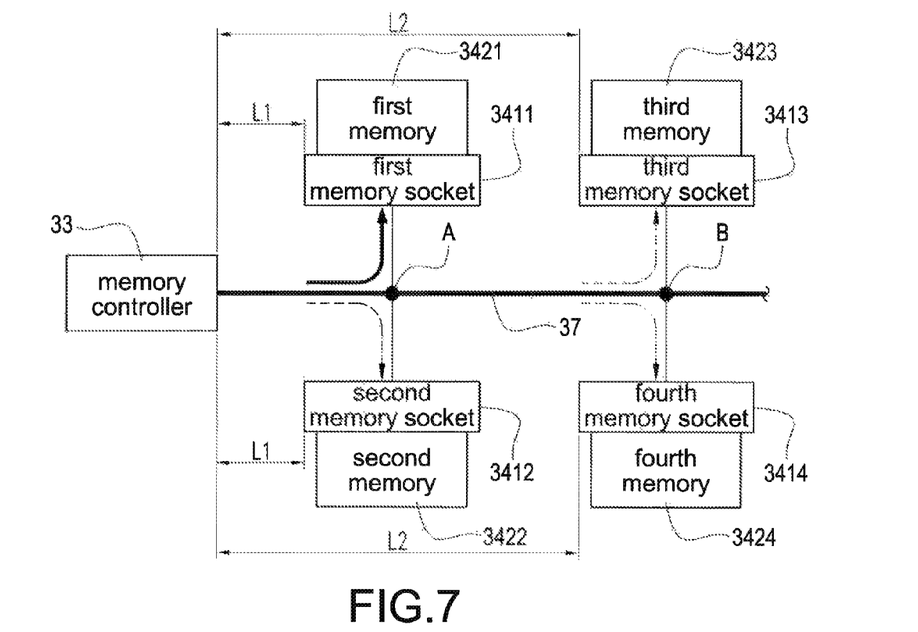
FIG. 7 is an architecture view of a first memory according to a first embodiment of the present disclosure.

Reference is made to FIG. 3 to FIG. 6, which are a front view, a rear view, a schematic view, and a block diagram of a storage device according to a first embodiment of the present disclosure. The storage device 3 mainly includes a circuit board 31, a memory controller 33 (referred to as a controller 33 hereinafter), a memory module 34, and a bus which is shown in FIG. 7 and labeled as the bus 37. The controller 33, the memory module 34, and the bus 37 are installed on the circuit board 31, respectively. The circuit board 31 has a transmission interface 32 thereon. More specifically, the transmission interface 32 is a peripheral component interconnect express (PCI-E) interface. The storage device 3 is inserted in a PCI-E socket 42 installed on an external computer motherboard 41 via the transmission interface 32 to execute signal communication with the computer motherboard 41. However, the embodiment is only exemplified but is not intended to limit the scope of the disclosure.

The controller 33 is electrically connected to the transmission interface 32 via the circuit board 31 so that the controller 33 is communicated with the computer motherboard 41 via the transmission interface 32. Accordingly, the controller 33 receives control commands sent from the computer motherboard 41 and accesses the memory module 34 according to the received control command.

The bus 37 is electrically connected to the controller 33 via the circuit board 31. The memory module 34 is electrically connected to the bus 37 via the circuit board 31 so that the memory module 34 is communicated with the controller 33 via the bus 37. In other words, the bus 37 plays a role of a signal communication bridge between the controller 33 and the memory module 34 in the storage device 3. Especially, the storage device 3 uses a single bus 37 to access all data in the memory module 34 in this embodiment.

The memory module 34 is composed of at least two memory sockets 341 and at least two volatile memories 342. In this embodiment, each memory socket 341 is a small outline dual in-line memory module (SO-DIMM) socket; each volatile memory 342 is a double data rate synchronous dynamic random access memory (DDR SDRAM), or the DDR3 is preferred. However, the embodiments are only exemplified but are not intended to limit the scope of the disclosure. The memory socket 341 is installed on the circuit board 31 and electrically connected to the bus 37 via the circuit board 31. The volatile memory 342 is inserted in the memory socket 341 so that the volatile memory 342 receives control signals from the bus 37 via the memory socket 341 and sends data to the bus 37 via the memory socket 341.

Figure 3:
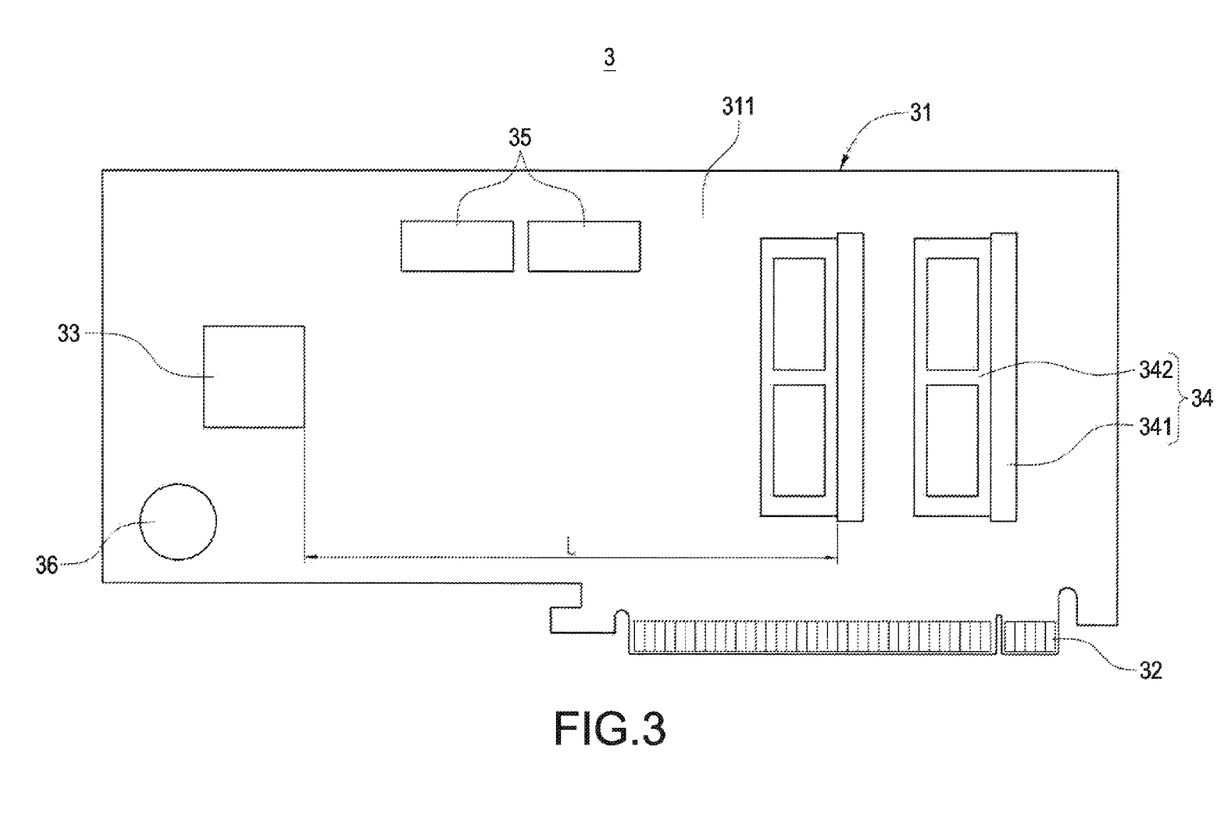
FIG. 3 is a front view of a storage device according to a first embodiment of the present disclosure.
Figure 4:
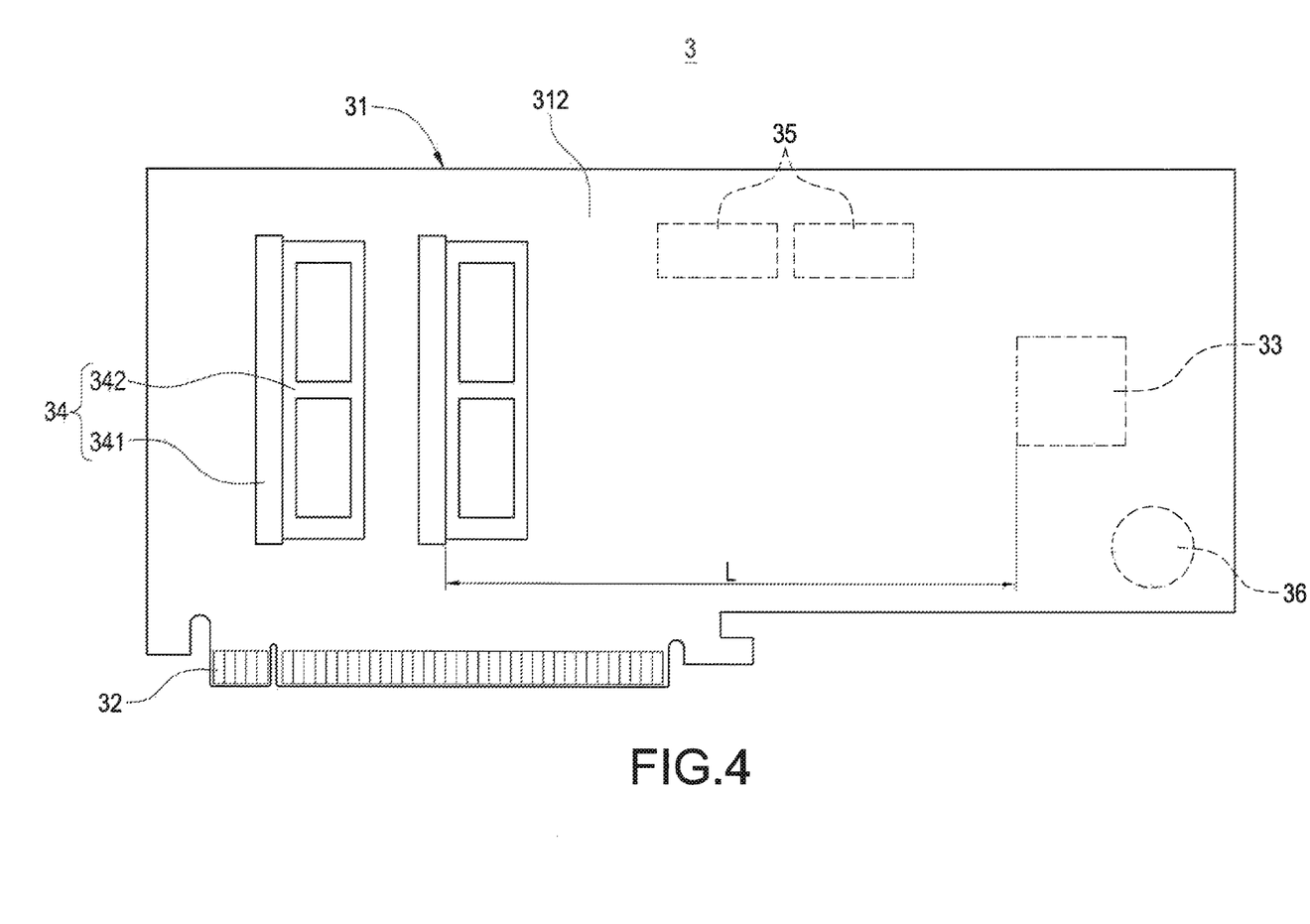
FIG. 4 is a rear view of the storage device according to the first embodiment of the present disclosure.

As shown in FIG. 3 and FIG. 4, the circuit board 31 has a front surface 311 and a rear surface 312. The at least two memory sockets 341 and the at least two volatile memories 342 are installed on the front surface 311 and the rear surface 312 of the circuit board 31. Especially, the amount of the memory socket 341 installed on the front surface 311 is equal to the amount of the memory socket 341 installed on the rear surface 312. In this embodiment, there are two memory sockets 341 are installed on the front surface 311 and thus there are two memory sockets 341 are installed on the rear surface 312. However, the amount of the memory socket 341 installed on the front surface 311 and the rear surface 312 is only exemplified but is not intended to limit the scope of the disclosure.

More specifically, each memory socket 341 installed on the front surface 311 is correspondingly to each memory socket 341 installed on the rear surface 312. Also, a distance L as labeled in FIG. 3 between the controller 33 and the memory socket 341 installed on the front surface 311 is equal to a distance L as labeled in FIG. 4 between the controller 33 and the memory socket 341, which is corresponding to the memory socket 341 installed on the front surface 311, installed on the rear surface 312.

The storage device further includes a power supply unit 36. The power supply unit 36 is installed on the circuit board 31 and is electrically connected to the controller 33 and the memory module 34 via the circuit board 31 so as to supply the required power to the controller 33 and the memory module 34. In this embodiment, the power supply unit 36 is a battery; and in another embodiment, the power supply unit 36 can be a power wire connector. The storage device 3 can be connected to an external power wire via the power wire connector so as to acquire the required power to supply the storage device 3. However, the embodiments are only exemplified but are not intended to limit the scope of the disclosure.

The storage device 3 further includes a backup memory module 35. The backup memory module 35 is installed on the circuit board 31 and is electrically connected to the controller 33 via the circuit board 31. The backup memory module 35 is mainly composed of a plurality of non-volatile memories 351. In this embodiment, each non-volatile memory 351 can be a flash memory, but not limited.

In the present disclosure, the volatile memories 342 in the memory module 34 are used as the main storage media in the storage device 3. The main characteristic of the volatile memory 342 is that the volatile memory retains the information as long as power supply is on, but when power supply is off or interrupted, the stored memory is lost. Accordingly, it is not convenient for uses to operate the volatile memory 342 even if the volatile memory 342 has the characteristic of rapid access speed. Although the access speed of the non-volatile memory 351 is slightly slower than that of the volatile memory 342, the non-volatile memory 351 can retain the stored memory even if power supply is off. Accordingly, the non-volatile memory 351 is provided to be a backup storage medium so as to avoid the risk of losing data stored in the volatile memories 342 once the storage device is powered off.

In the present disclosure, the storage device 3 is connected to the computer motherboard 41 via the transmission interface 32 so that the storage device 3 receives data from the computer motherboard 41 and the received data are controlled by the controller 33 to be written into the volatile memories 342. Especially, the volatile memories 342 can provide a plurality of dependent storage spaces for storing different types of data. Also, the volatile memories 342 can be integrated to form a large-capacity storage space, such as the memory module 34. In this example, thirty volatile memories 342 are exemplified for further demonstration. The thirty volatile memories 342 can be regarded as thirty dependent storage spaces, such as thirty hard disks by the controller 33 or regarded as a large capacity hard disk with a thirty-time storage space, but not limited.

As shown in FIG. 6, the controller 33 is simultaneously electrically connected to the memory module 34 and the backup memory module 35. The controller 33 is used to store data in the memory module 34. Further, the controller 33 controls the memory module 34 to back up the data from the volatile memories 342 to the backup memory module 35 when necessary, such as when the storage device 3 is powered off so as to avoid the risk of losing data. In addition, the controller 33 control the backup memory module 35 to restore the backup data from the non-volatile memories 351 of the backup memory module 35 to the memory module 34 when necessary, such as when the storage device 3 is powered. Accordingly, the volatile memories 342 are provided to obtain extremely rapid access speed.

Figure 8:
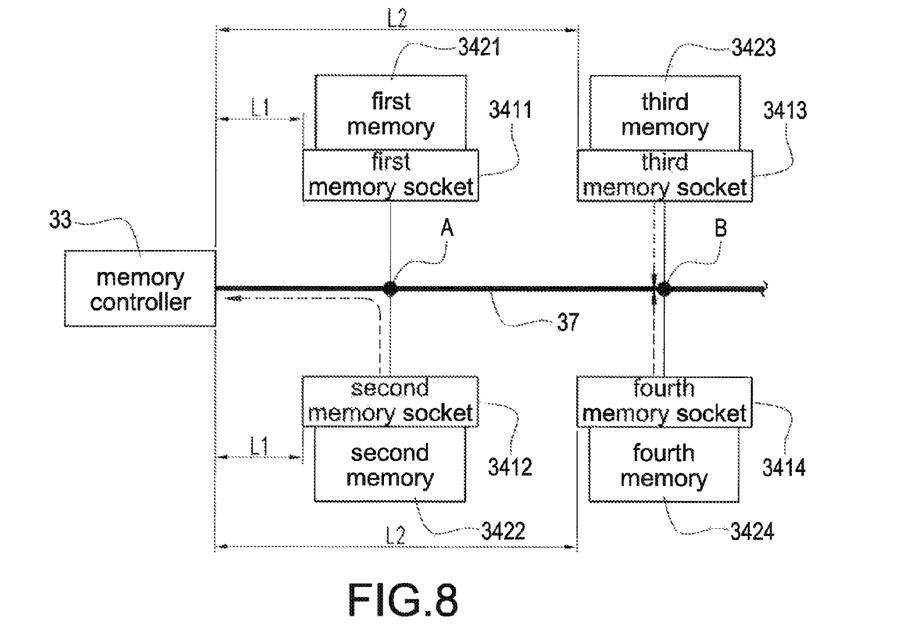
FIG. 8 is an architecture view of a second memory according to a first embodiment of the present disclosure.

Reference is made to FIG. 7 and FIG. 8 which are an architecture view of a first memory and an architecture view of a second memory according to a first embodiment of the present disclosure, respectively. In the present disclosure, the controller 33 uses the single bus 37 to connect all of the memory sockets 341 and accesses the stored data in the volatile memories 342 via the memory sockets 341. As shown in FIG. 7 and FIG. 8, the bus 37 has at least one connection point, such as a connection point A and a connection point B. The connection point A or the connection point B is used to connect two memory sockets 341 arranged up and down the circuit board 31, and the volatile memories 342 are accessed via the corresponding memory sockets 341. The two memory sockets 341 connected at the connection point A are installed on the front surface 311 of the circuit board 31, and the two memory sockets 341 connected at the connection point B are installed on the rear surface 312 of the circuit board 31. In particular, the two memory sockets 341 installed on the front surface 311 are correspondingly arranged to the two memory sockets 341 installed on the rear surface 312. Also, a distance between one memory socket 341 and the controller 33 is equal to a distance between the other memory socket 341 and the controller 33.

As shown in FIG. 7, a first memory socket 3411 and a second memory socket 3412 are jointly connected at a connection point A. In particular, a first memory 3421 is inserted in the first memory socket 3411 and a second memory 3422 is inserted in the second memory socket 3412. The first memory socket 3411 and the second memory socket 3412 are correspondingly installed on the front surface 311 and the rear surface 312 of the circuit hoard 31. Also, a distance between the first memory socket 3411 and the controller 33 is equal to a distance between the second memory socket 3412 and the controller 33.

In addition, a third memory socket 3413 and a fourth memory socket 3414 are disclosed in FIG. 7. The third memory socket 3413 and the fourth memory socket 3414 are jointly connected at a connection point B of the bus 37. In particular, a third memory 3423 is inserted in the third memory socket 3413 and a fourth memory 3424 is inserted in the fourth memory socket 3414. Similarly, the third memory socket 3413 and the fourth memory socket 3414 are correspondingly installed on the front surface 311 and the rear surface 312 of the circuit board. 31. Also, a distance between the third memory socket 3413 and the controller 33 is equal to a distance between the fourth memory socket 3414 and the controller 33.

When the controller 33 accesses the first memory 3412, tiny amount of currents flow to the second memory 3422, the third memory 3423, and the fourth memory 3424. Because the second memory 3422, the third memory 3423, and the fourth memory 3424 are not accessed, the tiny amount of currents would be reflected therefrom. Because the phenomenon of the signal reflection is the ordinary skill in the art, however, the detail description is omitted here for conciseness.

As shown in FIG. 8, because the third memory socket 3413 and the fourth memory socket 3414 are jointly connected at the connection point B and the distance between the third memory socket 3413 and the controller 33 is equal to the distance between the fourth memory socket 3414 and the controller 33, the current reflected from the third memory 3423 is cancelled by the current reflected from the fourth memory 3424. In other words, the current reflected from the third memory 3423 and the current reflected from the fourth memory 3424 would not flow back to the controller 33. That is, the extremely tiny amount of residual current after the currents are cancelled would not cause noise interference.

Especially, the special connection structure of the volatile memories 342 and the memory sockets 341 is designed to cancel the currents reflected from the two volatile memories 342 arranged up and down the circuit board 31 and connected to the same connection point of the bus 37. Accordingly, the amount of the memory socket 341 and that of the volatile memory 342 are two or multiples of two.

Figure 9:
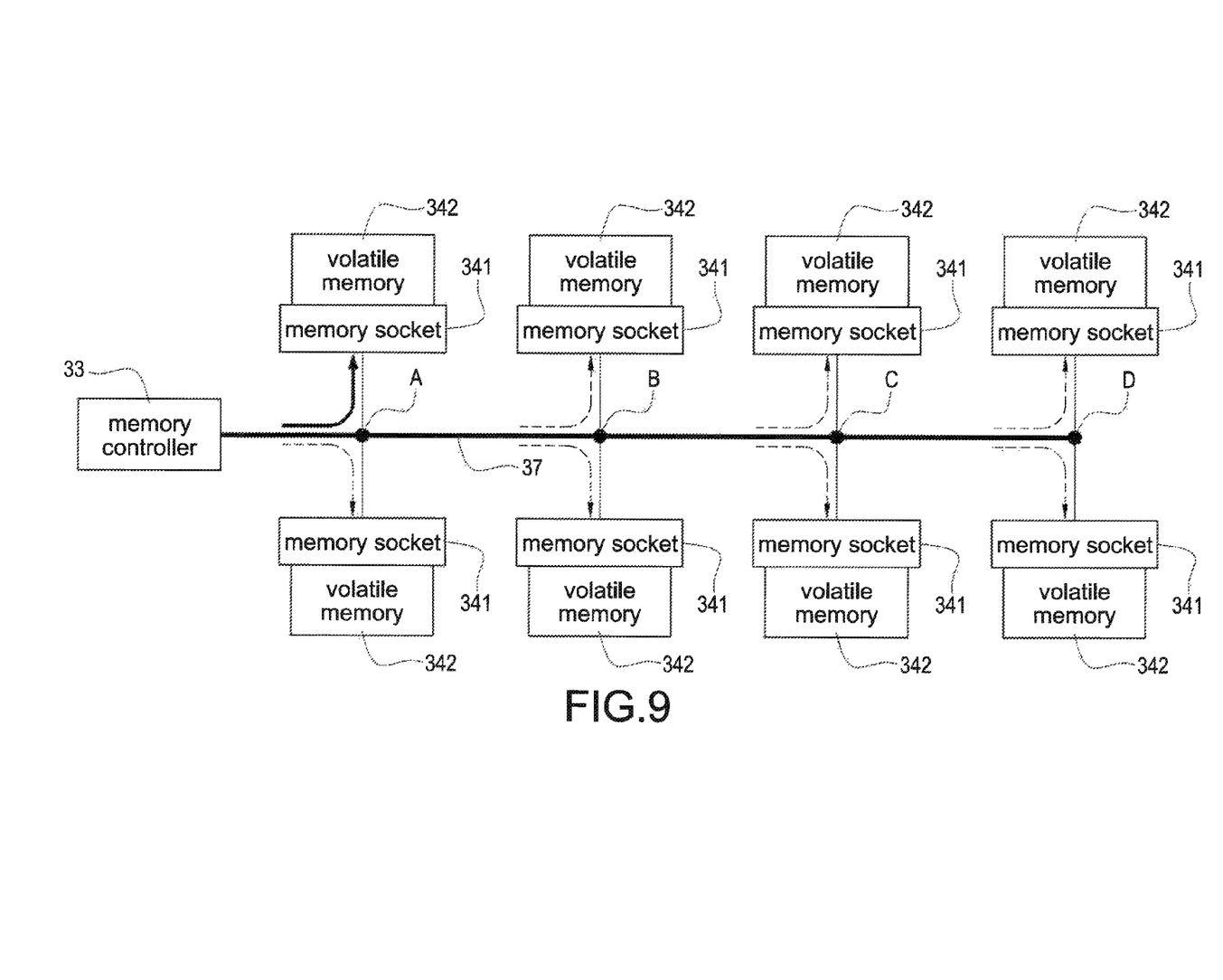
FIG. 9 is an architecture view of the first memory according to a second embodiment of the present disclosure.
Figure 10:
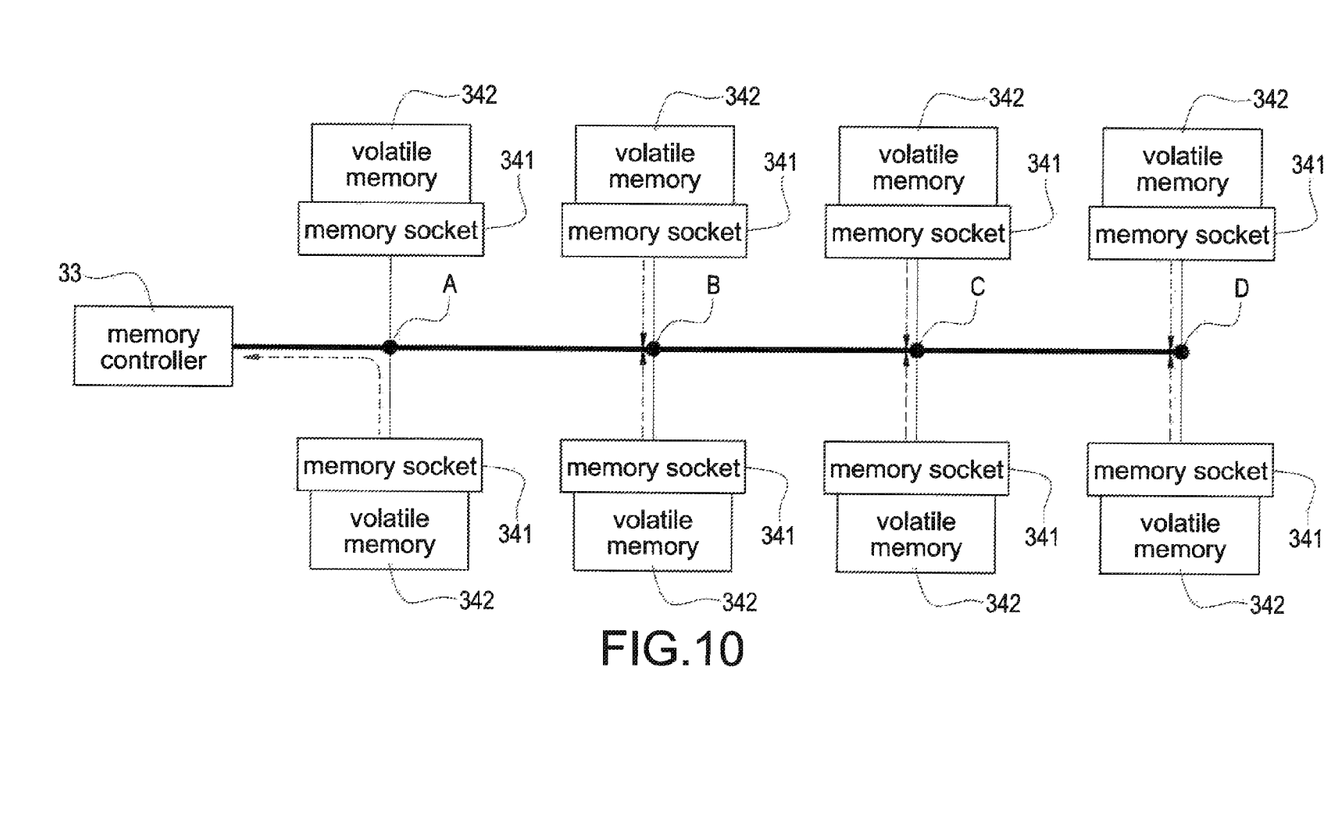
FIG. 10 is an architecture view of the second memory according to a second embodiment of the present disclosure.

Reference is made to FIG. 9 and FIG. 10 which are an architecture view of the first memory and an architecture view of the second memory according to a second embodiment of the present disclosure, respectively. The major difference between FIG. 9 (or FIG. 10) and FIG. 7 (or FIG. 8) is that the amount of the memory socket and/or the memory in FIG. 9 is distinct from the amount of the memory socket and/or the memory in FIG. 7. In FIG. 7 and FIG. 8, four memory sockets and/or four memories are exemplified for further demonstration; and in FIG. 9 and FIG. 10, eight memory sockets and/or eight memories are exemplified for further demonstration. In addition, at least four connection points A, B, C, D are provided in FIG. 9 and FIG. 10. Similarly, each of the connection points A, B, C, D can be connected to two memory sockets 341 arranged up and down the circuit board 31, and the corresponding volatile memories 342 are accessed via the memory sockets 341.

As shown in FIG. 9 and FIG. 10, when the controller 33 accesses one volatile memory 342 connected to the connection point A, tiny amount of currents flow to other seven volatile memories 342. However, the two currents reflected from the two volatile memories 342 connected at the connection point B are cancelled, the two currents reflected from the two volatile memories 342 connected at the connection point C are cancelled, and also the two currents reflected from the two volatile memories 342 connected at the connection point D are cancelled. In other words, most of the reflected currents are cancelled and the extremely tiny amount of residual current after the currents are cancelled would not interfere the control commands sent from the controller 33.

According to the disclosed connection structure of the memories above, each volatile memory 342 does not need the ODT (on-die termination) function. Also, even though each volatile memory 342 has the built-in ODT function and the ODT function does not be activated, the problem of the signal reflection in the storage device 3 can be overcome. Accordingly, the overall power consumption of the storage device 3 will not increase comparing to the storage device using the ODT function. In addition, because the volatile memories 342 do not have or do not use the ODT function, the operation temperature of the storage device 3 is lower comparing to the storage device using the ODT function so that the storage device 3 can be operated under a more stable condition.

Figure 11:
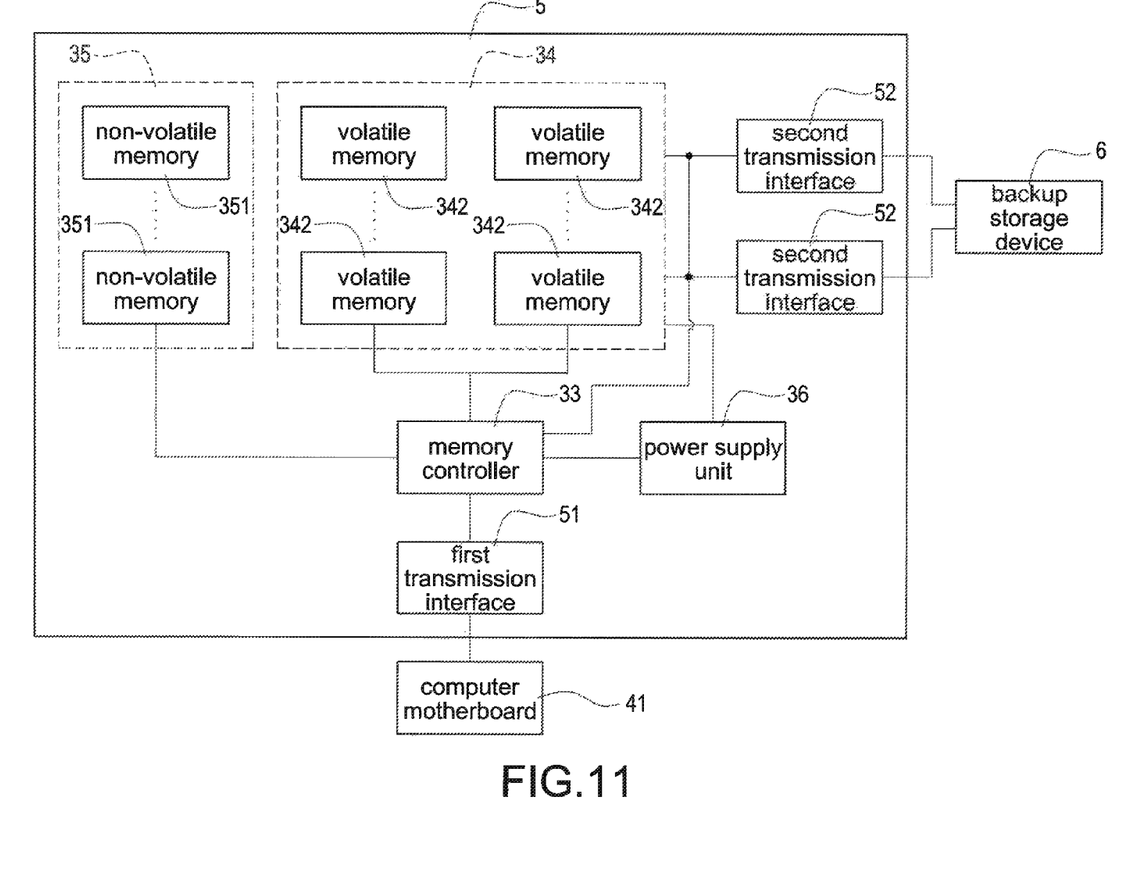
FIG. 11 is a block diagram of the storage device according to a third embodiment of the present disclosure.
Figure 12:
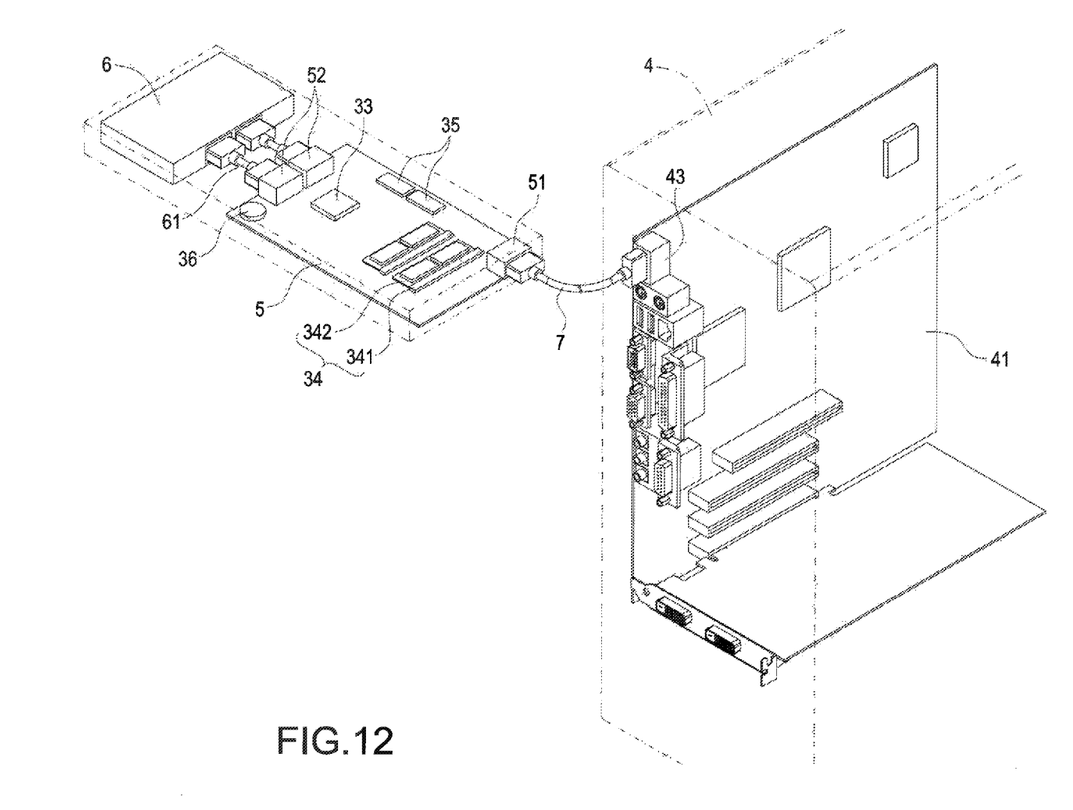
FIG. 12 is a schematic view of installing the storage device according to the third embodiment of the present disclosure.

Reference is made to FIG. 11 and FIG. 12 which are a block diagram of the storage device and a schematic view of installing the storage device according to a third embodiment of the present disclosure. In this embodiment, another storage device 5 is disclosed. The major difference between the storage device 5 and the storage device 3 shown in FIG. 6 is that the storage device 5 further includes a first transmission interface 51 and at least one second transmission interface 52. The storage device 5 can be connected to the external computer motherboard 41 via the first transmission interface 51; and the storage device 5 can be connected to a backup storage device 6 via the at least one second transmission interface 52. The second transmission interface 52 is installed on the circuit board 31 and electrically connected to the controller 33 and the memory module 34 via the circuit board 31. The backup storage device 6 is electrically connected to the controller 33, the memory module 34, and the backup memory module 35 via the second transmission interface 52.

In this embodiment, each second transmission interface 52 is a serial advance technology attachment (SATA) interface. The storage device 5 is connected to an internal transmission line 61, such as a SATA transmission line via the second transmission interface 52 and electrically connected to the backup storage device 6 via the internal transmission line 61. Especially, the backup storage device 6 includes at least one hard disk, such as a magnetic head accessing hard disk or a solid-state hard disk. The storage device 5 is connected to the backup storage device 6 via the second transmission interface 52 to back up the data from the memory module 34 to the backup storage device 6 or copy the data from the backup memory module 35 to the backup storage device 6, thus effectively increasing backup spaces.

Furthermore, the backup storage device 6 can be composed of a plurality of hard disks and the amount of the second transmission interface 52 can be two (exemplified in the FIG. 11 and FIG. 12) or more than two. The storage device 5 can back up the data from the memory module 34 to the hard disks of the backup storage device 6 using the RAID (redundant array of independent disks) manner via the second transmission interfaces 52. In addition, the storage device 5 can also copy the data from the backup me y module 35 to the backup storage device 6 using the RAID manner, thus effectively increasing speed of data backup. Especially, the amount of the backup storage device 6 and the second transmission interface 52 is only exemplified but is not intended to limit the scope of the disclosure.

As a result, when the memory module 34 and/or the backup memory module are damaged or insufficient storage space thereof, the backup storage device 6 can be used to back up the data with the RAID manner to increase speed of data backup. Finally, the storage device 5 uses the controller to control the backup storage device 6 to restore the backup data to the memory module 34 or the backup memory module 35.

Another embodiment in the present disclosure is that the backup storage device 6 can be set to an independent hard disk and connected to the external computer motherboard 41 via the first transmission interface 51 or the second transmission interface 52 to receive and transmit data.

In the embodiment as mentioned above, the storage device 3 is directly inserted in the PCI-E socket 42 of the computer motherboard 41, that is the storage device 3 is built in a computer host (such as the computer host 4 shown in FIG. 12) having the computer motherboard 41. However, the storage device 3, 5 can be an external storage device, also referred to as a portable storage device. In this embodiment, the first transmission interface 51 can be an external serial advance technology attachment (e-SATA) or a universal serial bus 3.0 (USB 3.0), but not limited. Accordingly, the storage device 3, 5 can connect to an external transmission line 7, such as the e-SATA transmission line or the USB transmission line via the first transmission interface 51, and connect to a corresponding port 43 on the computer motherboard 41 via the external transmission line 7 so as to establish a connection to the computer host 4.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A memory connection structure of a storage device, comprising:
    a circuit board having a front surface and a rear surface; the circuit board having a transmission interface thereon, and the storage device connected to an external computer motherboard via the transmission interface;
    a memory controller installed on the circuit board and electrically connected to the transmission interface via the circuit board;
    a bus installed on the circuit board and electrically connected to the memory controller via the circuit board; the bus having at least one connection point;
    a memory module installed on the circuit board and electrically connected to the bus via the circuit board; the memory module composed of at least two memory sockets and at least two volatile memories; the at least two volatile memories connected to the bus via the corresponding memory sockets;
    wherein each connection point of the bus is connected to the two memory sockets, and the two volatile memories are correspondingly accessed via the two memory sockets; the two memory sockets are correspondingly installed on the front surface and the rear surface of the circuit board, respectively, and a distance between the memory socket installed on the front surface and the memory controller is equal to a distance between the memory socket installed on the rear surface and the memory controller.

2. The memory connection structure of the storage device in claim 1, wherein the amount of the at least two memory sockets and the amount of the at least two volatile memories are two or multiples of two.

3. The memory connection structure of the storage device in claim 2, wherein the amount of the at least two memory sockets is eight and the amount of the at least two volatile memories is eight; the bus has at least four connection points, and each connection point is connected to two memory sockets arranged up and down the circuit board, and the two volatile memories are accessed via the two memory sockets, respectively.

4. The memory connection structure of the storage device in claim 2, wherein the transmission interface is a peripheral component interconnect express (PCI-E), an external serial advance technology attachment (e-SATA), or a universal serial bus 3.0 (USB 3.0).

5. The memory connection structure of the storage device in claim 2, wherein the memory socket is a small outline dual in-line memory module (SO-DIMM); the volatile memory is a double data rate synchronous dynamic random access memory (DDR SDRAM).

6. The memory connection structure of the storage device in claim 2, further comprising a power supply unit installed on the circuit board and electrically connected to the memory controller and the memory module via the circuit board.

7. The memory connection structure of the storage device in claim 6, wherein the power supply unit is a battery or a power wire connector.

8. The memory connection structure of the storage device in claim 2, further comprising a backup memory module installed on the circuit board and electrically connected to the memory controller via the circuit board; wherein the backup memory module is composed of a plurality of non-volatile memories; the memory controller is configured to control the memory module to back up the data from the at least two volatile memories to the backup memory module; the memory controller is configured to control the backup memory module to restore the backup data from the non-volatile memories of the backup memory module to the memory module.

9. The memory connection structure of the storage device in claim 8, wherein each of the non-volatile memories is a flash memory.

10. The memory connection structure of the storage device in claim 8, further comprising
at least a second transmission interface installed on the circuit board and electrically connected to the memory controller and the memory module via the circuit board; and a backup memory device electrically connected to the second transmission interface and electrically connected to the memory controller, the memory module, and the backup memory module via the second transmission interface;

wherein the memory controller is configured to control the memory module or the backup memory module to back up the data from the memory module or the backup memory to the backup storage device; and the memory controller is configured to control the backup storage device to restore the backup data from backup storage device to the memory module or the backup memory module.

11. The memory connection structure of the storage device in claim 10, wherein the second transmission interface is a serial advance technology attachment (SATA).

12. The memory connection structure of the storage device in claim 11, wherein the backup storage device is composed of hard disks, and the amount of the second transmission interface is two or more than two; the memory controller is configured to back up the data from the memory module or the backup memory module to the backup storage device using a redundant array of independent disks (RAID) manner via the second transmission interfaces.

* * * * *